United States Patent

Bhatia et al.

[11] Patent Number: 4,464,212
[45] Date of Patent: Aug. 7, 1984

[54] METHOD FOR MAKING HIGH SHEET RESISTIVITY RESISTORS

[75] Inventors: Harsaran S. Bhatia, Wappingers Falls; Jacob Riseman, Poughkeepsie, both of N.Y.

[73] Assignee: International Business Machines Corporation, Armonk, N.Y.

[21] Appl. No.: 449,122

[22] Filed: Dec. 13, 1982

[51] Int. Cl.³ .......................................... H01L 21/225
[52] U.S. Cl. .................................... 148/187; 148/188; 29/576 C; 29/578
[58] Field of Search ................... 148/187, 188; 29/578, 29/576 C

[56] References Cited

U.S. PATENT DOCUMENTS

| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,298,401 | 11/1981 | Nuez et al. | 148/1.5 |
| 4,332,070 | 6/1982 | Kant | 29/578 |
| 4,333,227 | 6/1982 | Horng et al. | 29/578 X |

Primary Examiner—G. Ozaki
Attorney, Agent, or Firm—Robert J. Haase

[57] ABSTRACT

A high sheet resistivity, doped semiconductor resistor is made by a process which produces a resistor diffusion or ion implantation mask having a narrow dimension determined by a "sidewall" technique. The sidewall technique defines the narrow dimension by the thickness of a doped or undoped layer deposited on a different underlying layer having horizontal and vertical surfaces. The horizontal portion of the deposited layer is removed by anistropic etching to leave only the vertical portion. The vertical portion, if undoped, is removed to define a diffused or ion-implanted resistor. The vertical portion, if doped, optionally may be removed, after heating to form a diffused resistor, or may be left in place to form a resistor in shunt with the diffused resistor.

2 Claims, 6 Drawing Figures

METHOD FOR MAKING HIGH SHEET RESISTIVITY RESISTORS

BACKGROUND OF THE INVENTION

1. Field of the Invention

The present invention generally relates to a process for making high sheet resistivity doped semiconductor resistors and, more particularly, to a process for making such resistors characterized by very narrow and controllable width dimensions.

2. Description of the Prior Art

There is an increasing need for doped semiconductor resistors of high sheet resistivity and small dimensions for use in very large scale integrated (VLSI) circuits. One way to achieve high sheet resistivity is to reduce the width dimension of the resistor to less than a micron, e.g., of the order of 200 to 500 nanometers. This approach is preferred where total resistor size is to be kept at a minimum. The major problem to be solved is how such narrow dimensions are to be achieved for a resistor in a controllable and reproducible manner.

Conventional processes for making doped semiconductor resistors employ lithographic masking techniques for delineating the area of the resistor for diffusion or ion implantation. Light, electron beam and X-ray lithography have been used, in turn, as shorter wavelength radiation was resorted to in an effort to increase resolution to achieve the narrow dimensions desired. For reasons of insufficient resolution or undue expense and complexity or unacceptable reproducibility, each of the foreging approaches has been found to be inadequate to meet the VLSI need for high sheet resistivity doped semiconductor resistors.

So called "sidewall" processes for fabricating narrow dimensioned base, emitter and collector reach-through regions of bipolar transistors or source, drain and channel regions of field effect transistors are taught in U.S. Pat. Nos. 4,209,349 and 4,209,350, filed in the names of Irving T. Ho and Jacob Riseman on Nov. 3, 1978 and for making narrow dimensioned vertical insulating regions between conductive layers is disclosed in U.S. Pat. No. 4,234,362 filed in the name of Jacob Riseman on Nov. 3, 1978 and assigned to the present assignee. Briefly, the narrow dimension is determined by the thickness of a layer deposited upon a different underlying layer having horizontal and vertical surfaces. The horizontal portion of the deposited layer is removed by anistropic etching to leave only the vertical portion which then serves either as a mask for diffusion or ion implantation or as a shaped source of impurity in the event that the deposited layer was doped.

SUMMARY OF THE INVENTION

The present invention exploits the "sidewall" technology of the prior art to determine the narrow dimension of a diffused or ion implanted resistor of high sheet resistivity and small area. Sheet resistivity R is defined by the well-known expression $R=\rho(l/w)$. The resistivity factor $\rho$ can be controlled by diffusion time and temperature or by the implanted dose. The length l, normally being greater than 1 micrometer, can be established by ordinary lithographic techniques. The width w, when determined by the submicron sidewall technique in accordance with the present invention, can be made small enough and with sufficient control and reproducibility to yield the high value of sheet resistivity desired for the resistor.

In different species of the invention, the sidewall is undoped or doped and, if doped, it is either removed or left in place to become part of the final structure of the resistor.

DESCRIPTION OF THE PREFERRED EMBODIMENT

Figure 1:
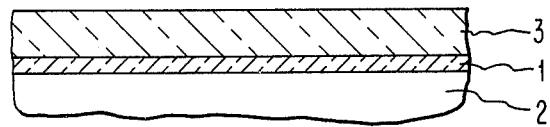
FIGS. 1–5 are simplified cross-sectional views and FIG. 6 is a plan view of the structure resulting at respective points in the method sequence of a preferred embodiment of the present invention where the sidewall material is removed.

Only the process steps involved in making the high sheet resistivity resistor of the present invention will be described. Referring to FIG. 1, it is presumed that conventional process steps already have been exercised to form desired VLSI structures (not shown) such as, for example, subcollector, epitaxial layer and recessed oxide isolation such as shown, for example, in FIGS. 3A–3F of the aforementioned U.S. Pat. No. 4,209,350 and as described beginning on column 7, line 36. After such structures have been completed and it is desired to fabricate the resistors, a thin layer 1 of $SiO_2$ is thermally grown on the substrate, which is epitaxial layer 2 in the example given. This is followed by the chemical vapor deposition of about 5000 Å of silicon dioxide 3.

Figure 2:
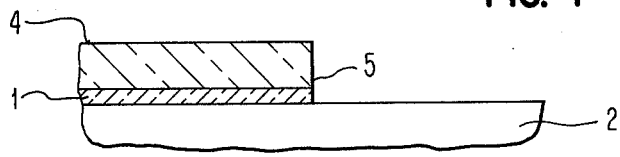

The silicon dioxide layers 1 and 3 are selectively reactively ion etched away as shown in FIG. 2 to leave a substantially horizontal surface 4 and a substantially vertical surface 5, the latter surface defining one edge of the narrow dimension of the desired resistor. The reactive ion etching process, per se, is convenional and is described in the paper "A Survey of Plasma-Etching Processes" by Richard L. Bersin published in Solid State Technology, May 1976, pages 31 through 36 and in "Reactive Ion Etching of Silicon", J. N. Harvilchuck, et al., patent application Ser. No. 594,413 filed July 9, 1975, now abandoned, and continuation patent application Ser. No. 822,775 filed Aug. 8, 1977, now abandoned, and continuation patent application Ser. No. 960,322 filed Nov. 14, 1978, now abandoned, and continuation patent application Ser. No. 436,544 filed Oct. 25, 1982 and assigned to the assignee of the present patent application.

Figure 3:
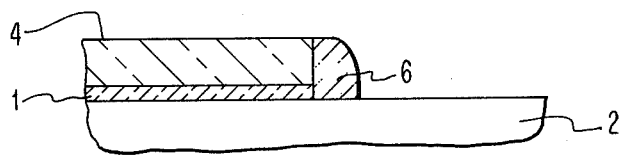

A blanket deposit of about 5000 Å of silicon next is placed over the structure of FIG. 2 and it is blanket reactively ion etched to remove the polycrystalline silicon from all horizontal surfaces, leaving only the vertical wall 6 of polycrystalline silicon of FIG. 3. It should be noted that any other material, such as silicon nitride, may be substituted for the polycrystalline silicon, provided that the substituted material is compatible with semiconductor device structure and processing and provided that it can be etched away without significant loss of silicon dioxide.

Figure 4:
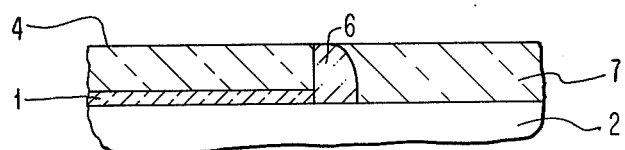

Approximately 5000 Å of silicon dioxide 7 is deposited over the device of FIG. 3 and, in turn, is covered by about one micrometer of resist (not shown). The composite layers are then etched away using $O_2$ reactive ion etching for the organic resist layer and $CF_4$ or $CF_4+H_2$ for the $SiO_2$ layer which removes the silicon dioxide at the same rate that is removes the resist to planarize the composite structure as shown in FIG. 4.

The planarization etching is continued until the surface of vertical wall 6 is exposed as shown.

Figure 6:
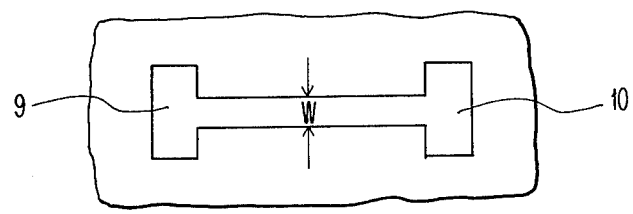

In the present embodiment, where the polysilicon is undoped, the polycrystalline silicon is removed by chemical etching in order to expose the underlying substrate (epitaxial layer 2). The exposed area is characterized by a width W separating oxides 4 and 7 which is determined with all of the precision and reproducibility with which the thickness of polycrystalline silicon 6 is controlled, whereby dimensions of the order of 200 to 500 nanometers are controllably realized. Dopant atoms are introduced into the exposed epitaxial layer by diffusion or by ion implantation to form the desired resistor 8. Contact areas 9 and 10 of FIG. 6 are delineated by conventional lithographic techniques and contacts are made thereto.

As an alternative to the deposition of 5000 Å of $SiO_2$ to the structure of FIG. 3 as explained above, the preexisting oxide 4 can be removed (not shown) leaving a sidewall stud 6 of polycrystalline silicon. Oxide is deposited or grown over the entire article including the stud and then is covered by resist and planarized down to the polycrystalline silicon as described before.

Figure 5:
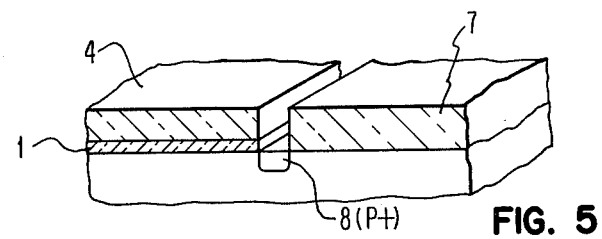

In another embodiment of the invention, the polycrystalline silicon 6 is doped so that when the structure of FIG. 4 is reached, it is only necessary to apply heat to cause the diffusion of the dopant into the epitaxial layer beneath the polycrystalline silicon to produce the resistor 8 of FIG. 5. The doped polycrystalline silicon optionally may be left in place or removed by etching prior to the placement of contacts 9 and 10 of FIG. 6. If left in place in the final structure, the doped polycrystalline silicon itself becomes a resistor in shunt with the resistor 8 diffused into epitaxial layer 2.

We claim:

1. The method of fabricating a first doped polycrystalline silicon resistor comprising:
    providing a monocrystalline silicon semiconductor body;
    forming a first insulator material layer upon a major surface of said body;
    anisotropically etching said first layer, leaving a substantially vertical edge of said first layer where said resistor is to be formed;
    forming a second layer of doped polycrystalline silicon material, having a different anisotropic etching characteristic as compared to said first layer, over said first layer;
    anisotropically etching said second layer to substantially remove the horizontal portions of said second layer and leave the substantially vertical portion of said second layer on said edge of said first layer, thereby forming the body of said first resistor;
    forming a third layer of said first insulator material over the resulting structure, said third layer being substantially coplanar with said vertical portion of said second layer; and
    making electrical contact to the terminal portions of said first resistor body.

2. The method of claim 1 wherein said monocrystalline semiconductor body is of a first conductivity type and said doped polycrystalline silicon material is of the opposite conductivity type, and further including:
    heating said resulting structure so as to diffuse the dopant from said resistor body into said semiconductor body to form a second resistor body in shunt with said first resistor body.

* * * * *